US005693149A

United States Patent [19]

Passer et al.

[11] Patent Number: 5,693,149

[45] Date of Patent: Dec. 2, 1997

[54] PROCESS FOR TREATING DISK-SHAPED WORKPIECES WITH A LIQUID

[75] Inventors: Bernd Passer, Burghausen; Rudolf Wengbauer, Mehring; Ludwig Pichlmeier, Reut, all of Germany

[73] Assignee: Wacker Siltronic Gesellschaft für Halbleitermaterialien Aktiengesellschaft, Burghausen, Germany

[21] Appl. No.: 634,527

[22] Filed: Apr. 17, 1996

Related U.S. Application Data

[63] Continuation of Ser. No. 310,888, Sep. 22, 1994, abandoned.

[30] Foreign Application Priority Data

Oct. 27, 1993 [DE] Germany .......................... 43 36 704.6

[51] Int. Cl.$^6$ .......................................... B08B 3/08

[52] U.S. Cl. .............................. 134/26; 134/27; 134/36

[58] Field of Search ............................ 134/26, 27, 28, 134/29, 30, 36, 37, 34, 94.1, 95.1, 200, 902; 95/149

[56] References Cited

U.S. PATENT DOCUMENTS 4,561,903 12/1985 Blaul ........................................ 134/18
4,617,065 10/1986 Sundheimer .............................. 134/26
4,722,752 2/1988 Steck ........................................ 134/30
4,778,532 10/1988 McConnell et al. ...................... 134/29
4,816,081 3/1989 Mehta et al. .............................. 134/30
4,925,495 5/1990 Crisp et al. .............................. 134/26
5,011,542 4/1991 Weil ........................................ 134/26
5,039,349 8/1991 Schoeppel ................................ 134/26
5,045,117 9/1991 Witherell .................................. 134/21
5,169,454 12/1992 Weil .................................... 134/34 X
5,181,985 1/1993 Lampert et al. ........................ 156/635
5,201,958 4/1993 Breunsbach et al. ...................... 134/1
5,201,960 4/1993 Starov ...................................... 134/37
5,288,333 2/1994 Tanaka et al. ............................ 134/37

FOREIGN PATENT DOCUMENTS 0344764 12/1989 European Pat. Off. .
2183552 6/1987 United Kingdom .
A-2183552 6/1987 United Kingdom .
WO92/21142 11/1992 WIPO .
9403284 2/1994 WIPO .

*Primary Examiner*—Robert J. Warden
*Assistant Examiner*—Saeed Chaudhry
*Attorney, Agent, or Firm*—Collard & Roe, P.C.

[57] ABSTRACT

A process for treating disk-shaped workpieces with a liquid in a chamber which can be sealed in gas-tight manner, in which the workpieces stacked in a transport rack are brought into contact with the fed-in liquid in the closed chamber, the liquid is conducted away out of the chamber and noxious vapors or gases originating from the liquid are scrubbed out and are conducted away out of the chamber in the dissolved condition.

7 Claims, 1 Drawing Sheet

24 24 2 1 3 4 4 14 115 15 21 23 20 22 12 27 11 111 26 25 13 18 19 116 16 17 5 6 8 7 9 10 105 106 108 117 107 109 110

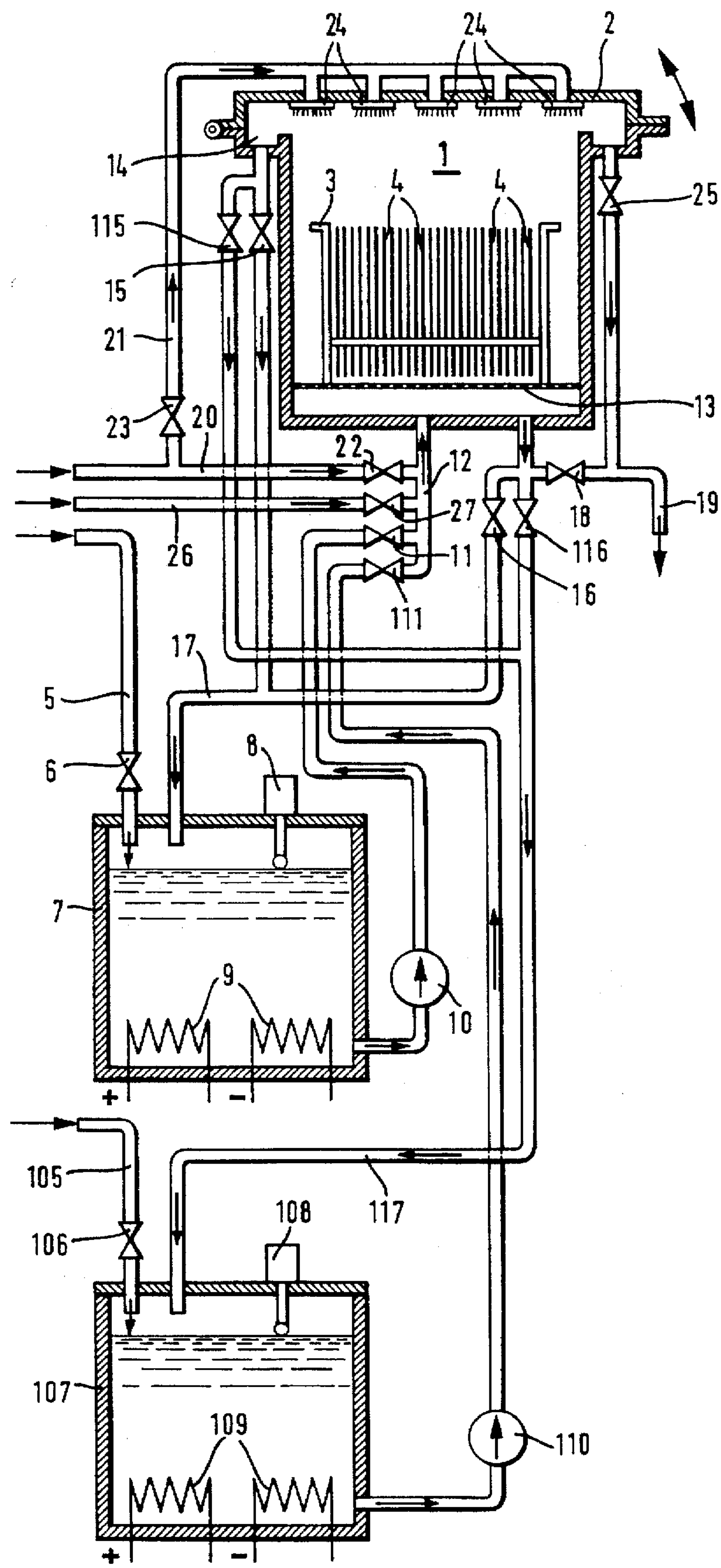
24
24
2
1
14
3
4
4
25
115
15
21
13
23
20
22
12
27
18
19
26
11
116
16
111
17
5
8
6
7
9
10
105
117
108
106
107
109
110

PROCESS FOR TREATING DISK-SHAPED WORKPIECES WITH A LIQUID

This is a continuation of application Ser. No. 08/310,888 filed on Sep. 22, 1994 now abandoned.

BACKGROUND OF THE INVENTION

1. Field of the Invention

The present invention relates to a process and an apparatus for treating disk-shaped workpieces with a liquid in a chamber which can be sealed in a gas-tight manner.

The workpieces under consideration may be in particular semiconductor wafers. However, it is also possible to treat other disk-shaped workpieces, for example, optical or magnetic disks made of glass in the apparatus according to the invention in accordance with the process according to the invention.

2. The Prior Art

International Patent Application WO-92/21142 discloses a process and an apparatus for cleaning semiconductor wafers. The apparatus comprises a cylindrical reactor. To charge the reactor, the semiconductor wafers must be lifted out of transport racks and passed over to retaining elements in the interior of the reactor. During the cleaning, the semiconductor wafers execute rotational movements in the closed reactor. The cleaned semiconductor wafers must subsequently be lifted back into the transport racks. Both in the course of charging and discharging, and also during the cleaning, the semiconductor wafers are in the immediate vicinity of mechanically moving parts of the device. There is the danger that as a result of this, the semiconductor wafers will be contaminated and/or damaged.

The liquids which are employed for the treatment of disk-shaped workpieces are frequently sources of noxious vapors or gases. Within the meaning of the present invention, vapors or gases are regarded as noxious if the active substances contained in them are suspected of being injurious to health or have been proven to be injurious to health. Usually, the noxious vapors or gases which are formed during the treatment of the workpieces must be removed, with the aid of gas extraction ducts, from the apparatus in which the treatment takes place and for example rendered harmless in external gas scrubbers. This requires high investment costs and considerably restricts the flexibility in the selection of the location of the apparatus, since installation is possible only where the space for the gas scrubbing is available.

The prior art has not disclosed any satisfactory proposals for solutions with regard to the avoidance of the emission of noxious vapors or gases from an apparatus of any type for treating disk-shaped workpieces with a liquid.

SUMMARY OF THE INVENTION

It is an object of the present invention to provide a process and an apparatus for treating disk-shaped workpieces with a liquid, in which the workpieces do not need either to be taken out of transport racks or moved during the treatment.

It is an additional object to prevent the emission of noxious vapors or gases from the apparatus in an effective manner.

The above objects are achieved according to the present invention by a process for treating disk-shaped workpieces with a liquid in a chamber which can be sealed in a gas-tight manner, which process is defined in that the workpieces stacked in a transport rack are brought into contact with the fed-in liquid in the closed chamber, the liquid is conducted away out of the chamber and noxious vapors or gases originating from the liquid are scrubbed out and conducted away out of the chamber in the dissolved condition.

Furthermore, the objects are achieved according to the present invention by an apparatus for treating disk-shaped workpieces with a liquid, comprising a chamber which can be sealed in gas-tight manner to receive the workpieces stacked in a transport rack; a receiver container to receive the liquid; means for feeding the liquid out of the receiver container into the sealable chamber; means for conducting away the liquid out of the sealable chamber into the receiver container; means for thermostatically controlling the liquid fed into the sealable chamber; and means for scrubbing out noxious vapors or gases which originate from the liquid.

Examples of liquids which may form noxious vapors or gases are formic acid, hydrofluoric acid, nitric acid, ammonia and caustic potash. It is possible for these compounds to be present in concentrated form or as dilute aqueous solutions, or as mixtures of the mentioned compounds and organic solvents.

Examples of treatment with a liquid, during which noxious vapors or gases may be generated, are decementing, cleaning, etching, coating and hydrophilation of semiconductor wafers.

During the process according to the present invention, the disk-shaped workpieces are stacked in racks, which are used for the transport of the workpieces. The lifting out of the workpieces from the transport racks or a relocation of the workpieces in other carrier bodies immediately before or after the treatment is not provided. In the first instance, one or more transport racks charged with workpieces are introduced into a chamber which is sealable in gas-tight manner and the chamber is sealed. Subsequently, the liquid provided for treating the workpieces is fed into the chamber. Preferably, in this case a quantity of liquid is pumped into the chamber, such that the liquid level achieved fully covers the workpieces. After a specified period of action, which is dependent upon the liquid, the liquid is pumped off or drained off again from the chamber.

In the case where during the treatment of the workpieces with the liquid, noxious vapors or gases have been formed, which have remained in the chamber after the liquid has been conducted away, it is provided in the first instance to scrub out these vapors or gases and to remove them from the chamber in the dissolved condition. Water-soluble vapors or gases are preferably scrubbed out with water or aqueous solutions and the resulting waste water is conducted away out of the chamber into a waste water container. Vapors or gases of organic origin, which are insoluble in water or have only poor solubility in water, are expediently scrubbed out with an organic solvent and, in a condition dissolved in a liquid organic phase, and conducted away out of the chamber into a disposal container.

Preferably, the medium provided for the scrubbing out of the vapors or gases is sprayed in the chamber, in order to increase the surface area effective in the course of absorption. If necessary, the scrubbing out of noxious vapors or gases is repeated once or on a plurality of occasions. As a rule, however, it is sufficient to spray medium in on a single occasion until the chamber is flooded and then to empty the chamber.

Following the scrubbing out of noxious vapors or gases and after the emptying of the chamber, the treatment of the workpieces with the same or another liquid can be continued in a manner similar to the above described procedure. If required, a plurality of successive treatments can be carried out in this fashion; in this case, the workpieces stacked in the transport rack remain in the closed chamber.

A special case of the treatment of the workpieces with a liquid is represented by the drying of the workpieces with the use of hot water. In the first instance, hot water at a temperature of 85° to 95° C. is fed into the chamber, until the workpieces are penetrated fully therewith. After this, the hot water is slowly removed again from the chamber, for example, by being pumped off or drained off. In this case, the workpieces dry at the phase boundary of the water draining off, without in this case having to be moved and without a drying gas stream having to be fed in.

It is possible to have several receiver containers for receiving additional liquids which are then fed into the sealable chamber.

When the treatment of the workpieces with the liquid has been completed and, if necessary, any noxious vapors or gases which have been formed have been scrubbed out and conducted away out of the chamber, the chamber can be opened. The workpieces are thereupon available for a subsequent further-processing program without further rearrangement measures, since they are stacked in standardized transport racks.

BRIEF DESCRIPTION OF THE DRAWINGS

Other objects and features of the present invention will become apparent from the following detailed description considered in connection with the accompanying drawing which discloses the embodiments of the present invention. It should be understood, however, that the drawing is designed for the purpose of illustration only and not as a definition of the limits of the invention.

The figure shows the apparatus for treating disk-shaped workpieces with a liquid.

DETAILED DESCRIPTION OF PREFERRED EMBODIMENTS

Turning now in detail to the drawings, the figure shows the apparatus for treating disk-shaped workpieces with a liquid and essentially comprises a chamber 1, which can be sealed in gas-tight manner by cover 2. The workpieces 4 which are stacked in one or more of the customary transport racks 3 are situated, for the treatment with the liquid, in the closed chamber. The chamber is connected to a plurality of in-feed ducts and drain ducts. The total number thereof is determined by how many different liquids are to act on the workpieces in successive treatments. In the case of the present embodiment, it is assumed that in addition to hot water for drying and cold water for scrubbing out noxious vapors or gases, only one liquid must be made available for treating the workpieces. This liquid is fed in via supply duct 5 and inlet valve 6 to receiver container 7. The receiver container is equipped with a filling level control 8 and a combined cooling and heating device 9, so that the liquid for treating the workpieces can, if required, be thermostatically controlled. With the aid of pump 10, the liquid can be fed out of the receiver container 7 through inlet valve 11 and in-feed duct 12 to the chamber 1 and distributed by means of perforated floor 13. When overflow valve 15 is opened, overflow 14 ensures that when an appropriate filling level has been reached in the chamber, the liquid is transported back into the receiver container. In this way, the constant exchange of liquid in the chamber and in the receiver container during the treatment of the workpieces can be guaranteed. Return valve 16 and return duct 17 are provided in order to conduct the liquid out of the chamber back into the receiver container, after the treatment of the workpieces. Over and above this, the liquid can, if required, be transferred via drain valve 18 and drain duct 19 into a disposal container (not shown).

Any noxious vapors or gases which are formed during the treatment are, in accordance with the embodiment shown, scrubbed out by feeding cold water into the chamber. To this end, in-feed ducts 20 and 21 are available. Cold water can either be fed to the chamber directly via in-feed valve 22, or via the in-feed valve 23 and spray nozzles 24. The in-feed of cold water into the chamber can take place simultaneously directly and via the spray nozzles, or only via the spray nozzles. A further overflow valve 25 permits the scrubbed-out vapors or gases to be conducted away via drain duct 19 into a waste water container (not shown). Alternatively, drain valve 18 and drain duct 19 can be used for this purpose.

To dry the workpieces by a treatment with the use of hot water, the latter is directly fed through in-feed duct 26 and in-feed valve 27 into the chamber. For the requisite heating of the workpieces, the in-feed of hot water is continued until a target temperature has been reached. Excess water is conducted away via overflow valve 25 and drain duct 19 into a waste water container (not shown). In a corresponding manner, drain valve 18 and drain duct 19 are available subsequently to conduct away the hot water out of the chamber again at a speed determining the process of drying the workpieces.

The apparatus of the invention further comprises one or more additional receiver containers 107 for receiving one or more additional liquids through means 105, 106 and 108; means 110 and 111 for feeding the additional liquid(s) out of the additional receiver container(s) into the sealable chamber 1; means 115, 116 and 117 for conducting away the additional liquid(s) out of the sealable container into the additional receiver container(s) 107; and means 109 for thermostatically controlling the additional liquid(s) fed into the sealable chamber.

It is to be understood that the mentioned in-feed ducts or drain ducts are connected to reservoirs (not shown) and in which the respective media are made available or disposed of. Preferably, the transport of the media takes place by means of feed pumps which are likewise not shown in the drawing.

Preferably, all parts of the apparatus which come into contact with the liquid are made of inert plastic material that does not react with the vapors, gases or liquids. This applies especially to the internal walls of the chamber and of the receiver container, as well as the internal walls of the in-feed ducts and drain ducts connecting them. Examples of these inert plastics include thermoplastic materials such as polyolefins like polyethylene, fluorocarbon resins like polyvinylidene fluoride, perfluoralkoky fluorocarbon resin and thermosetting materials such as phenol formaldehyde resin.

The apparatus which has been described above has a great potential for automation. If further receiver containers are connected, the workpieces can be treated with a plurality of liquids in successive steps, without the apparatus needing to be opened in between and the workpieces needing to be moved. Even during the treatment with a liquid, the workpieces are not moved and do not stand in the immediate vicinity of moving parts of the apparatus. As a result of the integrated capability of scrubbing out noxious vapors or gases, the apparatus can be used on a decentralized basis and in a manner independent of location. A change of location is possible at any time without any problem.

While several embodiments of the present invention have been shown and described, it is to be understood that many changes and modifications may be made thereunto without departing from the spirit and scope of the invention as defined in the appended claims.

What is claimed is:

1. A process for treating disk-shaped workpieces with a solvent in a closed chamber which is sealed in a gas tight manner, comprising bringing the workpieces stacked in a transport rack into the chamber;

closing and sealing said chamber in a gas tight manner to prevent the emission of noxious vapors or gases from said chamber; and contacting the workpieces with the solvent fed into the chamber;

conducting the solvent away out of the chamber;

scrubbing out noxious vapors or gases by feeding or spraying a liquid into the chamber; said liquid being selected from the group consisting of water, and aqueous solutions; and conducting said noxious vapors or gases dissolved in the liquid away out of the chamber.

2. The process as claimed in claim 1, wherein the solvent is an organic solvent.

3. The process as claimed in claim 1, wherein hot water is fed into the chamber to completely cover the workpieces and, afterwards, the hot water is slowly removed again from the chamber, the workpieces being dried when the hot water drains off.

4. The process as claimed in claim 1, wherein hot water at a temperature of 85° C. to 95° C. is fed into the chamber to completely cover the workpieces and, afterwards, the hot water is slowly removed again from the chamber, the workpieces being dried at the phase boundary of the water when the hot water drains off, without having to be moved and without a drying gas stream having to be fed in.

5. The process as claimed in claim 1, wherein the workpieces are semiconductor wafers.

6. The process as claimed in claim 1, comprising continuing the treatment of the workpieces by bringing the workpieces into contact with the same liquid or a liquid different therefrom.

7. A process for treating disk-shaped workpieces with a solvent in a closed chamber which is sealed in a gas tight manner, comprising bringing the workpieces stacked in a transport rack into the chamber;

closing and sealing said chamber in a gas tight manner to prevent the emission of noxious vapors or gases from said chamber; and contacting the workpieces with the solvent fed into the chamber;

conducting the solvent away out of the chamber;

scrubbing out noxious vapors or gases by feeding or spraying cold water into the chamber; and conducting said noxious vapors or gases dissolved in the cold water away out of the chamber.

* * * * *